United States Patent
Park

(10) Patent No.: US 9,837,636 B2
(45) Date of Patent: Dec. 5, 2017

(54) SUBSTRATE FOR ORGANIC LIGHT-EMITTING DEVICE WITH ENHANCED LIGHT EXTRACTION EFFICIENCY, METHOD OF MANUFACTURING THE SAME AND ORGANIC LIGHT-EMITTING DEVICE HAVING THE SAME

(71) Applicant: SAMSUNG CORNING PRECISION MATERIALS CO., LTD., Gumi-si, Gyeongsangbuk-do (KR)

(72) Inventor: Seong-Sik Park, Asan-si (KR)

(73) Assignee: Corning Precision Materials Co., Ltd., Asan-si, Chungcheongnam-do (KR)

( * ) Notice: Subject to any disclaimer, the term of this patent is extended or adjusted under 35 U.S.C. 154(b) by 374 days.

(21) Appl. No.: 13/857,607

(22) Filed: Apr. 5, 2013

(65) Prior Publication Data

US 2014/0131669 A1    May 15, 2014

(30) Foreign Application Priority Data

Apr. 6, 2012 (KR) .................. 10-2012-0035973

(51) Int. Cl.
*H01L 51/52* (2006.01)
*H01L 51/00* (2006.01)
*H01L 51/56* (2006.01)

(52) U.S. Cl.
CPC ...... *H01L 51/5275* (2013.01); *H01L 51/0096* (2013.01); *H01L 51/56* (2013.01); *Y02E 10/549* (2013.01)

(58) Field of Classification Search
CPC .. H01L 51/5275; H01L 51/56; H01L 51/0096
(Continued)

(56) References Cited

U.S. PATENT DOCUMENTS 6,052,213 A * 4/2000 Burt .............. G02B 6/124
359/237
6,674,778 B1 * 1/2004 Lin ................ B82Y 20/00
372/46.01
(Continued)

FOREIGN PATENT DOCUMENTS

CN 1578565 A 2/2005
CN 1781339 A 5/2006
(Continued)

OTHER PUBLICATIONS

English Abstract of Taniyama, JP 57075139.*
(Continued)

*Primary Examiner* — Hrayr A Sayadian
(74) *Attorney, Agent, or Firm* — McDermott Will & Emery LLP

(57) ABSTRACT

A substrate for an organic light-emitting device (OLED) with enhanced light extraction efficiency, a method of manufacturing the same and an OLED having the same, in which the light extraction efficiency is enhanced, thereby reducing the phenomenon of color shift in which color changes depending on the position of a viewer within the viewing angle. The transparent substrate used in an OLED includes an anode, an organic light-emitting layer and a cathode which are stacked on each other, the transparent substrate comprising a porous layer in at least one portion of one surface thereof that adjoins the organic light-emitting device, a refractive index of the porous layer being smaller than a refractive index of the transparent substrate.

13 Claims, 5 Drawing Sheets

(58) Field of Classification Search
USPC .................................................... 257/40, 98
See application file for complete search history.

(56) References Cited

U.S. PATENT DOCUMENTS

| | | | |
|---|---|---|---|
| 2005/0023967 A1* | 2/2005 | Gotoh | ................. H01L 51/0096 |
| | | | 313/504 |
| 2006/0071233 A1 | 4/2006 | Cho et al. | |
| 2007/0120136 A1 | 5/2007 | Noda et al. | |
| 2009/0126789 A1* | 5/2009 | Li | .......................... H01G 9/209 |
| | | | 136/256 |
| 2011/0114931 A1 | 5/2011 | Lee et al. | |

FOREIGN PATENT DOCUMENTS

| | | | |
|---|---|---|---|
| CN | 102097597 A | | 6/2011 |
| JP | 57075139 A | * | 5/1982 |
| JP | 2005-243319 A | | 9/2005 |
| KR | 10-2006-0030396 A | | 4/2006 |

OTHER PUBLICATIONS

Office action issued by the Chinese Patent Office dated May 13, 2015 regarding corresponding Chinese Patent Application No. 201310119716.9.

Office action issued by the Korean Intellectual Property Office dated Aug. 11, 2015 regarding corresponding Korean Patent Application No. 10-2012-0035973.

* cited by examiner

SUBSTRATE FOR ORGANIC LIGHT-EMITTING DEVICE WITH ENHANCED LIGHT EXTRACTION EFFICIENCY, METHOD OF MANUFACTURING THE SAME AND ORGANIC LIGHT-EMITTING DEVICE HAVING THE SAME

CROSS REFERENCE TO RELATED APPLICATION

The present application claims priority from Korean Patent Application Number 10-2012-0035973 filed on Apr. 6, 2012, the entire contents of which application are incorporated herein for all purposes by this reference.

BACKGROUND OF THE INVENTION

Field of the Invention

The present invention relates to a substrate for an organic light-emitting device (OLED) with enhanced light extraction efficiency, a method of manufacturing the same and an OLED having the same, and more particularly, to a substrate for an OLED with enhanced light extraction efficiency, a method of manufacturing the same and an OLED having the same, in which the light extraction efficiency is enhanced, thereby reducing the phenomenon of color shift in which color changes depending on the position of a viewer within the viewing angle.

Description of Related Art

In general, an organic light-emitting device (OLED) includes an anode, a light-emitting layer and a cathode. When a voltage is applied between the anode and the cathode, holes are injected from the anode into a hole injection layer and then migrate from the hole injection layer to the organic light-emitting layer, and electrons are injected from the cathode into an electron injection layer and then migrate from the electron injection layer to the light-emitting layer. Holes and electrons that are injected into the light-emitting layer recombine with each other in the light-emitting layer, thereby generating excitons. When such excitons transit from the excited state to the ground state, light is emitted.

Organic light-emitting displays including an OLED are divided into a passive matrix type and an active matrix type depending on a mechanism that drives an N×M number of pixels which are arranged in the shape of a matrix.

In an active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. The active matrix type organic light-emitting display consumes little power, and thus can be advantageously applied to high definition displays and large displays.

However, as shown in FIG. 6, only about 20% of light generated by an OLED is emitted to the outside and about 80% of the light is lost by a waveguide effect originating from the difference in the refractive index between a glass substrate 10 and an organic light-emitting layer 30 which includes an anode 20, a hole injection layer, a hole carrier layer, a light-emitting layer, an electro carrier layer and an electron injection layer and by a total internal reflection originating from the difference in the refractive index between the glass substrate 10 and the air. Specifically, the refractive index of the internal organic light-emitting layer 30 ranges from 1.7 to 1.8, whereas the refractive index of indium tin oxide (ITO) which is generally used for the anode 20 ranges from 1.9 to 2.0. Since the two layers have a very small thickness ranging from 100 nm to 400 nm and the refractive index of glass used for the glass substrate 10 is about 1.5, a planar waveguide is thereby formed inside the OLED. It is calculated that the ratio of the light that is lost in the internal waveguide mode due to the above-described reason is about 45%. In addition, since the refractive index of the glass substrate 10 is about 1.5 and the refractive index of the ambient air is 1.0, when the light is directed outward from the inside of the glass substrate 10, a ray of the light having an angle of incidence greater than a critical angle is totally reflected and is trapped inside the glass substrate 10. Since the ratio of the trapped light is up to about 35%, only about 20% of the generated light is emitted to the outside. Herein, reference numerals 31, 32 and 33 indicate components of the organic light-emitting layer 30. Specifically, 31 indicates the hole injection layer and the hole carrier layer, 32 indicates the light-emitting layer, and 33 indicates the electron injection layer and the electron carrier layer.

In addition, as shown in FIG. 7, in order to overcome the foregoing problem, in the related art, a low index grid (LIP) 50 is formed on the ITO anode 20. The grid 50 converts the direction of the light that travels in the waveguide mode to the front surface, thereby enhancing light extraction efficiency.

FIG. 8 shows a simulation result on the OLED shown in FIG. 7. The effect of enhancing the light extraction efficiency is increased when the refractive index of the grid 50 is lower. However, there are problems in that almost no materials have a refractive index of 1.2 or less and that the price of a material is more expensive when the refractive index is lower. In addition, when the grid 50 is formed on the ITO anode 20, as shown in FIG. 7, a stepped portion is formed. Consequently, leakage current may occur. In addition, the OLED shown in FIG. 7 has the problem of difficulty of processing. For example, in some cases, the surface of the anode 20 which adjoins the organic light-emitting layer 30 is metamorphosed in the process of forming the grid 50 on the ITO anode 20, thereby changing the work function. Furthermore, holes are not injected into the organic light-emitting layer 30 through the portion of the anode 20 on which the grid 50 is formed, and the size of the electric field applied thereto is different from the surroundings, thereby decreasing the uniformity of light generated.

In addition, as shown in FIG. 9, in the related art, a convex-concave structure 60 is disposed under the anode 20 (with respect to the paper surface), i.e. in the interface between the anode 20 and the glass substrate 10, in order to enhance light extraction efficiency.

As described above, the anode 20 and the organic light-emitting layer 30 generally act as one light waveguide between the cathode 40 and the glass substrate 10. Accordingly, in the state in which the anode 20 and the organic light-emitting layer 30 act in a waveguide mode, when the convex-concave structure 60 which causes light scattering is formed in the surface that adjoins the anode 20, the waveguide mode is disturbed, so that the quantity of light that is extracted to the outside is increased. However, when the convex-concave structure 60 is formed below the anode 20, the shape of the anode 20 resembles the shape of the convex-concave structure 60 below the anode 20, thereby increasing the possibility that a sharp portion may be localized. Since the OLED has a stacked structure of very thin films, when the anode 20 has a sharp protruding portion, current is concentrated in that portion, which acts as a reason for large leakage current or decreases power efficiency. Accordingly, in order to prevent such deterioration in the electrical characteristics, a flat film 70 is necessarily added when the convex-concave structure 60 is formed below the anode 20. The flat film 70 serves to make the convex and concave portions of the convex-concave structure 60 be flat. When the flat film 70 is not flat and has sharp protruding portions, the anode 20 also has protruding portions, which cause leakage current. Therefore, the flatness of the flat film 70 is very important and is required to be about Rpv=30 nm or less.

In addition, the flat film 70 is required to be made of a material, the refractive index of which is similar to that of the anode 20. If the refractive index of the flat film 70 is low, most light is reflected at the interface between the anode 20 and the flat film 70 before being disturbed by the convex-concave structure 60. The light is then trapped between the anode 20 and the organic light-emitting layer 30, which is referred to as the waveguide mode. The flat film 70 is required to be as thin as possible. If the flat film 70 is too thick, more light may be unnecessarily absorbed, and the effect of scattering may be decreased since the distance between the convex-concave structure 60 and the organic light-emitting layer 30 is too large.

However, the process of completely flattening the convex-concave structure 60 using the thin flat film 70 having a thickness of several hundreds of nm is very difficult. In addition, the methods of covering and flattening the convex-concave structure 60 include deposition coating and solution coating. Since the deposition coating is characterized by forming a film following the shape of the convex-concave structure 60, the solution coating is better than the deposition coating when forming the flat film 70. However, at present, it is very difficult to obtain a solution coating material that has a high refractive index, i.e. a refractive index that is equal to or greater than the refractive index of the ITO anode 20, and that satisfies process conditions for polycrystalline thin-film transistors, such as complicated conditions required on the surface of the OLED substrate and high-temperature processing.

In the related art, a micro-cavity structure was applied to an OLED in order to improve the light extraction efficiency of the OLED. Here, the ITO anode 20, or the transparent electrode, is made of ITO/metal/ITO. In this approach, a part of light is reflected from the anode 20 and micro cavities are formed between the anode 20 and the metal cathode 40 such that the light is subjected to constructive interference and resonance, thereby increasing the light extraction efficiency. However, this micro-cavity structure has the problem of causing color shift in which colors are changed depending on the position of a viewer within the viewing angle.

The information disclosed in the Background of the Invention section is only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a substrate for an organic light-emitting device (OLED) with enhanced light extraction efficiency, a method of manufacturing the same and an OLED having the same, in which the light extraction efficiency is enhanced, thereby reducing the phenomenon of color shift in which color changes depending on the position of a viewer within the viewing angle.

In an aspect of the present invention, provided is a transparent substrate used in an OLED which includes an anode, an organic light-emitting layer and a cathode which are stacked on each other, the transparent substrate comprising a porous layer in at least one portion of one surface thereof that adjoins the OLED, a refractive index of the porous layer being smaller than a refractive index of the transparent substrate.

In an exemplary embodiment of the invention, the transparent substrate having the porous layer may be in direct contact with the OLED.

The porous layer may be formed such that at least one component from among components of the transparent substrate except for silicon dioxide is eluted from the transparent substrate.

The porous layer may extend into the transparent substrate, a surface of the organic light-emitting device and a surface of the transparent substrate which adjoins the OLED form a flat surface.

The porous layer may have a porous layer pattern, a cross-sectional shape of the porous layer pattern being selected from the group consisting of a semi-oval, a trapezoid, and a wedge. The porous layer pattern may be selected from among a grid pattern, a pattern consisting of a plurality of stripes, a pattern consisting of a plurality of waves, a honeycomb pattern and a pattern consisting of a plurality of dots.

The width, the depth and the pitch of the porous layer pattern and the refractive index of the transparent substrate may satisfy the following relationships:

$$d:w \leq 2:1, \text{ and}$$

$$w/2 + d/(n_1^2 - 1)^{1/2} > p,$$

where d indicates the depth of the porous layer pattern, w indicates the width of the porous layer pattern, p indicates the pitch of the porous layer pattern, and $n_1$ indicates the refractive index of the transparent substrate.

The pitch of the porous layer pattern may be equal to or less than 200 nm or is equal to or greater than 1 μm.

The pitch of the porous layer pattern may be within the range of a wavelength of light emitted from the OLED, and has random values different from each other.

The porous layer may have a porous layer pattern having an oblong cross-section.

The width, the depth and the pitch of the porous layer pattern and the refractive index of the transparent substrate may satisfy the following relationships:

$$d:w \leq 2:1, \text{ and}$$

$$w + d/(n_1^2 - 1)^{1/2} > p,$$

where d indicates the depth of the porous layer pattern, w indicates the width of the porous layer pattern, p indicates the pitch of the porous layer pattern, and $n_1$ indicates the refractive index of the transparent substrate.

The pitch of the porous layer pattern may be equal to or less than 200 nm or is equal to or greater than 1 μm.

The pitch of the porous layer pattern may be within the range of a wavelength of light emitted from the OLED, and has random values different from each other.

The transparent substrate and the porous layer may be made of glass.

In another aspect of the invention, provided is a method of manufacturing a transparent substrate used in an OLED which includes an anode, an organic light-emitting layer and a cathode which are stacked on each other. The method includes forming a porous layer in at least one portion of one surface of the transparent substrate by eluting at least one component from among components of the transparent substrate except for silicon dioxide from the transparent substrate, a refractive index of the porous layer being smaller than a refractive index of the transparent substrate.

In an exemplary embodiment, the porous layer may have a porous layer pattern, a cross-sectional shape of the porous layer pattern being selected from the group consisting of a semi-oval, a trapezoid, an oblong and a wedge. The porous layer pattern may be selected from among a grid pattern, a pattern consisting of a plurality of stripes, a pattern consisting of a plurality of waves, a honeycomb pattern and a pattern consisting of a plurality of dots.

The porous layer may be formed via lithography.

The lithography may be implemented as a photolithography process which includes the following steps of: applying photoresist on the surface of the substrate; exposing a plurality of areas of the surface of the substrate by patterning the photoresist using a mask; forming the porous layer in an inward direction from the plurality of areas by eluting the components of the transparent substrate except for silicon dioxide; and removing the patterned photoresist.

The lithography may include the following steps of: coating the surface of the substrate with a coating material; forming semispherical nano particles by annealing at a temperature in vicinity of a melting point of the coating material; patterning the surface of the substrate so that the porous layer is formed using the nano particles as a mask; and removing the nano particles.

The pitch of the porous layer pattern may have random values different from each other.

The coating material may be one metal selected from among Ag, Au, Pt, Pd, Co, Ni, Ti, Al, Sn, Cr and alloys thereof.

The coating material may be a polymer or an oxide.

In a further aspect of the invention, provided is an OLED that includes a first substrate; a second substrate facing the first substrate; an anode disposed between the first and second substrates, the anode being stacked on the first substrate; an organic light-emitting layer stacked on the anode; and a cathode stacked on the organic light-emitting layer. The first substrate may include a porous layer in at least one portion of one surface thereof that adjoins the anode, a refractive index of the porous layer being smaller than a refractive index of the first substrate.

The first substrate having the porous layer may be in direct contact with the anode.

According to embodiments of the invention, it is possible to increase the light extraction efficiency by forming the porous layer, the refractive index of which is lower than that of glass, on the glass substrate.

In addition, since the porous layer is formed in the inner portions of the glass substrate, processing is easier than the process of separately forming the grid in the related art. It is possible to remove the problem of the decreased uniformity of light generated in the related art, which is caused by the stepped portion formed by the grid, as well as the problem of the occurrence of leakage current. Since the related art process of forming a convex-concave structure which causes light to scatter at the interface adjacent to the anode and a flat film which is formed in order to planarize the stepped portion formed by this structure can be omitted, it is also possible to simplify the process and structure.

Furthermore, since the porous layer has the scattering pattern selected from among a pattern consisting of a plurality of semi-oval cross-sections, a pattern consisting of a plurality of trapezoidal cross-sections, a pattern consisting of a plurality of oblong cross-sections and a pattern consisting of a plurality of wedge-shaped cross-sections, it is possible to reduce color shift by promoting color mixing.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
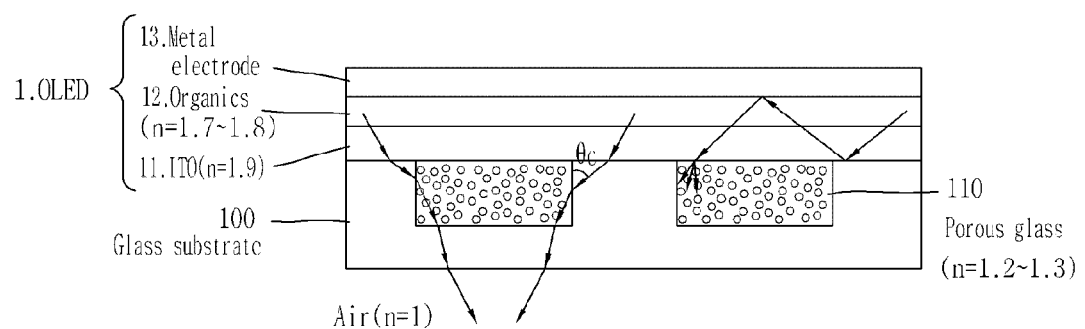
FIG. 1 is a cross-sectional view showing a substrate for an OLED according to an embodiment of the invention.

Reference will now be made in detail to a substrate for an OLED and a method of manufacturing the same according to the present invention, embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, a substrate 100 for an OLED according to an embodiment of the invention is one of opposing substrates which are used in an OLED 1, and is bonded to one surface of the OLED 1. The substrate 100 protects the OLED 1 from the external environment and while serving as a passage through which light generated by the OLED 1 is emitted to the outside.

Here, the OLED 1 has a stacked structure interposed between the substrate 100 for an OLED according to this embodiment of the invention and an encapsulation substrate (not shown) which faces the substrate 100, the stacked structure including an anode 11, an organic light-emitting layer 12 and a cathode 13 which are stacked on one another. The anode 11 can be made of a metal or an oxide, such as Au, In, Sn or indium tin oxide (ITO), that has a large work function in order to facilitate hole injection. The cathode 13 can be implemented as a metal thin film of Al, Al:Li or Mg:Ag having a small work function in order to facilitate electron injection. In the case of a top emissions structure, the cathode 13 can be implemented as a multilayer structure that includes a semitransparent electrode of a metal thin film made of Al, Al:Li or Mg:Ag and a transparent electrode of an oxide thin film of indium tin oxide (ITO) in order to facilitate transmission of light generated by the organic light-emitting layer 12. The organic light-emitting layer 12 includes a hole injection layer, a hole carrier layer, a light-emitting layer, an electron carrier layer and an electron injection layer which are sequentially stacked on the anode 11. In this structure, when a forward voltage is applied between the anode 11 and the cathode 13, electrons from the cathode 13 migrate to the light-emitting layer through the electron injection layer and the electron carrier layer, and holes migrate to the light-emitting layer through the hole injection layer and the hole carrier layer. The electrons and holes that have migrated into the light-emitting layer recombined with each other, thereby generating excitons. When such excitons transit from the excited state to the ground state, light is emitted. The brightness of the light emitted is proportional to the amount of current that flows between the anode 11 and the cathode 13.

As described above, the substrate 100 for an OLED according to this embodiment of the invention has one surface that adjoins the anode 11, a porous layer 110 being formed in at least one portion of the surface that adjoins the anode 11. The porous layer 110 serves to disturb the waveguide mode formed by the anode 11 and the organic light-emitting layer 12, thereby increasing the amount of light that is extracted to the outside. In addition, the porous layer 110 has a lower refractive index than the substrate 100. Due to this property, the porous layer 110 changes the direction of light that is emitted at a critical angle for total internal reflection between the substrate 100 and the air so that the angle of the light becomes smaller than the critical angle, thereby increasing the amount of light that is extracted to the outside. For this, the porous layer 110 is implemented as a layer, the refractive index of which is lower than that of a material of the substrate 100, i.e. glass. The lower refractive index is realized by pores present in the porous layer 110.

According to this embodiment of the invention, the porous layer 110 can have a grid pattern. In addition, the porous layer 110 can be configured as a pattern selected from among, but not limited to, a pattern consisting of a plurality of stripes, a pattern consisting of a plurality of waves, a honeycomb pattern and a pattern consisting of a plurality of dots. The cross-sectional shape of the pattern can be selected from among, but not limited to, a oblong, a trapezoid, a wedge and a semi-oval.

The substrate 100 for an OLED is implemented as soda lime glass when the OLED is used for illumination, and as alumino-silicate glass when the OLED is used for display. The substrate has silicon dioxide ($SiO_2$) as a major component although its composition may vary depending on the use. An elution process for forming the porous layer in the surface of the glass substrate includes dipping the glass substrate into an elution solution. The elution solution used in the elution process is implemented as hexafluorosilicic acid ($H_2SiF_6$) that is saturated by addition of $SiO_2$. A boric acid solution may be added to the elution solution. When $SiO_2$ is oversaturated in the $H_2SiF_6$ solution, $H_2SiF_6 \cdot SiF_4$ is produced. This consequently elutes the components of the glass substrate, except for strong bonding $\equiv$Si—O—Si$\equiv$ that has strong bonding force. Accordingly, a porous silica structure, or the porous layer 110, is formed in the substrate 100 such that it extends inward from the surface of the substrate 100.

The porous layer 110 is formed by eluting at least one component of the remaining components except for $SiO_2$ based on the above-described principle. This will be described later in greater detail in the method of manufacturing the substrate for an OLED.

In the porous layer 110 that is formed in the surface of the substrate 100 for an OLED as described above, the surface of the porous layer 110 is coplanar with the surface of the substrate 100, i.e. the interface between the substrate 100 and the anode 11. The pores of the porous layer 110 has a very small diameter of about several tens of nanometers, and the surface coarseness of the porous layer 110 is substantially the same as that of the original glass surface. It is therefore possible to fundamentally overcome the problems with the related art caused by the convex-concave structure on the anode, such as the occurrence of leakage current or the decreased uniformity of light due to the stepped portions. It is also possible to omit a complicated additional process, such as the process of forming the flat film that is intended to flatten the stepped portions.

It is also possible to overcome the problems with the related art caused by the presence of the convex-concave structure and the flat film below the anode. In the related art, for example, the leakage current occurred due to the low flatness, the light absorption and cost were unnecessarily increased due to the increase in the thickness intended to improve the flatness, and the scattering effect was reduced.

Figure 2:
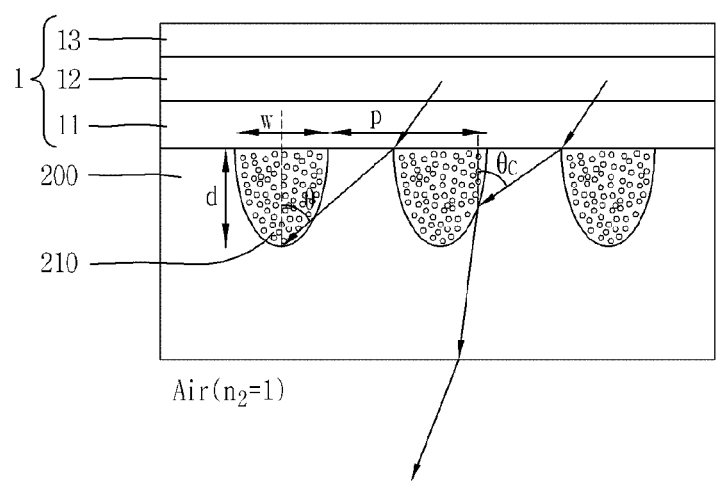
FIG. 2 is a cross-sectional view showing a substrate for an OLED according to another embodiment of the invention.
Figure 3:
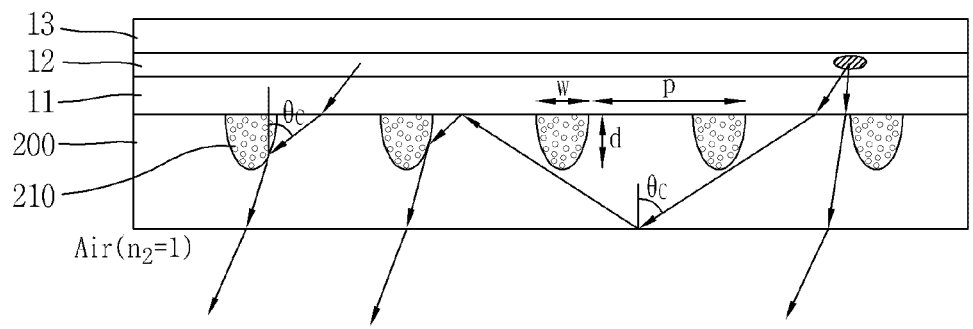
FIG. 3 is a schematic view showing an image blur caused by refraction of light and a waveguide effect.
Figure 4:
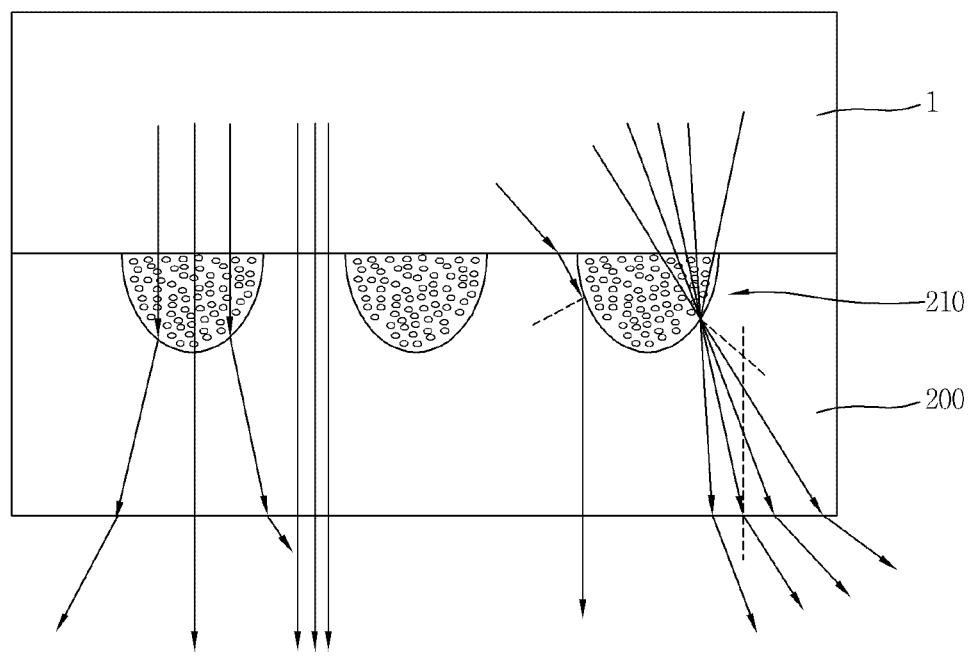
FIG. 4 is a schematic view showing refraction and scattering of light.

With reference to FIG. 2, FIG. 3 and FIG. 4, a description will be given below of a substrate for an OLED according to another embodiment of the invention.

FIG. 2 is a cross-sectional view showing the substrate for an OLED according to this embodiment of the invention, FIG. 3 is a schematic view showing an image blur caused by refraction of light and a waveguide effect, and FIG. 4 is a schematic view showing refraction and scattering of light.

As shown in FIG. 2 to FIG. 4, the substrate 200 for an OLED according to this embodiment of the invention includes a porous layer 210 that has a porous layer pattern selected from among, but not limited to, a pattern consisting of semi-oval cross-sections, a pattern consisting of a plurality of trapezoidal cross-sections, a pattern consisting of a plurality of oblong cross-sections and a pattern consisting of a plurality of wedge-shaped cross-sections. The porous layer 210 is formed in the substrate 200 such that it extends inward from the surface of the substrate 200 that adjoins the anode 11.

Comparing to the former embodiment of the invention, the structure of the OLED according to this embodiment of the invention is substantially the same as that of the former embodiment except for the shape of the pattern of the porous layer. Therefore, the same reference numerals will be used to designate the same components, and detailed descriptions thereof will be omitted.

Like the porous layer 110 according to the former embodiment of the invention, the porous layer 210 having the porous layer pattern according to this embodiment of the invention can be formed by creating pores inside the substrate 200 via elution. Consequently, the refractive index of the porous layer 210 is lower than that of the glass substrate 200, such that the porous layer 210 can disturb the waveguide mode caused by the anode 11 and the organic light-emitting layer 12. The porous layer 210 can also change the direction of light that is emitted at a critical angle for total reflection at the interface between the substrate 200 and the air so that the angle of the light becomes smaller than the critical angle, thereby increasing the amount of light that is extracted to the outside.

As shown in FIG. 3, a ray of the light emitted from the OLED 1 can travel inside the substrate 200 while being totally reflected at the interface between the substrate 200 and the air and/or the interface between the substrate 200 and the anode 11 without striking the porous layer 210 until it is emitted by being refracted and/or scattered by the porous layer 210. This ray of light causes an image blur, thereby deteriorating the image quality.

In order to overcome this problem, when the cross-section of pattern is a semi-oval, trapezoid or wedge, it is preferred that the depth and a pitch of the porous layer pattern and the refractive index of the transparent substrate satisfy the following relationships:

$$d{:}w \leq 2{:}1, \text{ and}$$

$$w/2 + d/(n_1^2-1)^{1/2} > p,$$

where d indicates the depth of the porous layer pattern, w indicates the width of the unit pattern of the porous layer 210, p indicates the pitch of the porous layer pattern, and $n_1$ indicates the refractive index of the transparent substrate.

Here, it is preferred that the depth d of the pattern be equal to or less than two times the width w of the pattern in order to remove a double image.

When the cross-section of the pattern is an oblong, it is preferred that the same ratios as in the above relationships be satisfied. In addition, the following formula must be satisfied.

$$w + d/(n_1^2-1)^{1/2} > p$$

The above formula is derived as follows.

When the cross-section of pattern is a semi-oval, trapezoid or wedge, the angle θ determined by the width w, depth d and pitch p of the porous layer pattern must satisfy the following formula:

$$\tan \theta = (p-w/2)/d$$

In order to prevent the image blur, the angle must be smaller than the critical angle for total reflection as in the following relationship:

$$\theta < \theta_c$$

The following result can be obtained based on the Snell's law, the critical angle condition and the above formulae.

$$\tan \theta_c = n_2/(n_1^2-n_2^2)^{1/2} > \tan \theta = (p-w/2)/d,$$

$$n_2/(n_1^2-n_2^2)^{1/2} > (p-w/2)/d, \text{ and}$$

$$w/2 + n_2 d/(n_1^2-n_2^2)^{1/2} > p$$

As described in the related art, the following relationship is required in order to remove a double image.

$$d{:}w \leq 2{:}1$$

Since the refractive index of the air is 1, the following formulae are derived.

$$n_2 = 1(\text{air}),$$

$$d{:}w \leq 2{:}1, w/2 + d/(n_1^2-1)^{1/2} > p$$

In the case of an oblong cross-section, w is substituted for w/2 in the same fashion.

In both of the two cases, the pitch p of the pattern is required to be equal to or greater than about 1 micrometers which is greater than the wavelength of light emitted from the OLED, or be equal to or smaller than about 200 nm which is smaller than the wavelength of the emitted light.

When the range of the pitch of the pattern is set similar to the range of or a value similar to the wavelength of the emitted light, it is preferred that the pitch of the pattern be random within the range of the wavelength of the light. (For example, it is preferred that the pattern has different pitches such that the pitch of one unit pattern is 500 nm and the pitch of an adjacent unit pattern is 530 nm.)

When a periodic pattern similar to the wavelength of the light emitted from the OLED 1 is formed, the spectrum of the light changes due to the Bragg grating and photonic crystal effects so that color change occurs depending on a change in the position of a viewer within the viewing angle.

In addition, as shown in FIG. 4, the porous layer 210 according to this embodiment of the invention can refract and scatter light that is incident from the OLED 1. Specifically, the porous layer 210 having the semi-oval shape changes the direction of a ray of light that is emitted in the direction normal to the interface between the OLED 1 and the substrate so that the direction of the ray is offset from the normal direction while changing the direction of a ray of light that is emitted in the direction offset from the normal direction so that the direction of the ray is normal to the interface. Accordingly, the porous layer 210 having the semi-oval shape can change the direction of light depending on the position of the viewer within the viewing angle, thereby reducing color shift that occurs in the OLED which has a micro-cavity structure in order to increase the light extraction efficiency by promoting color mixing.

Figure 5:
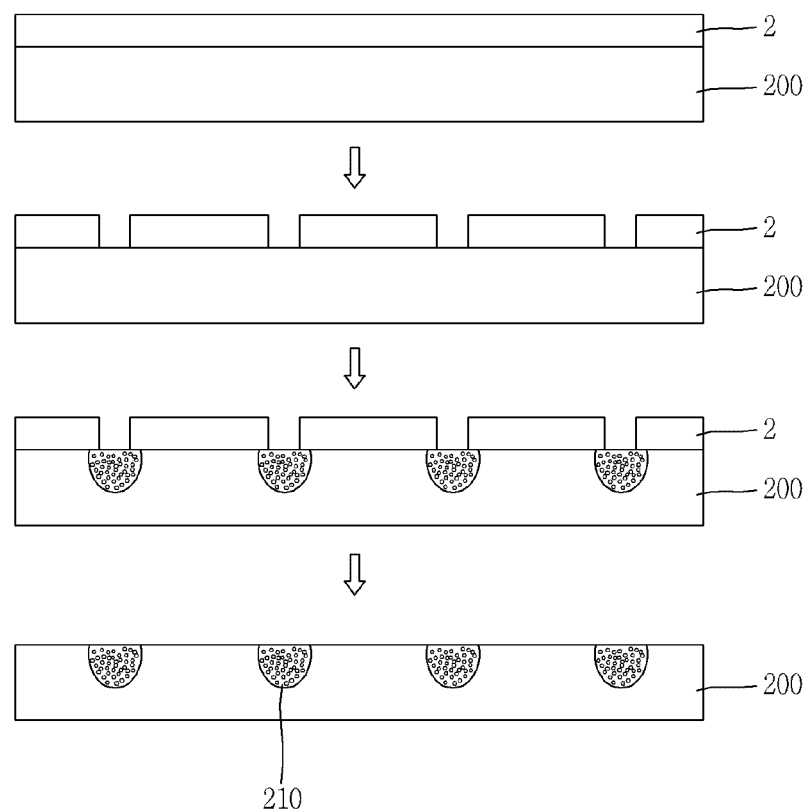
FIG. 5 is a process view showing a method of manufacturing a substrate for an OLED according to an embodiment of the invention.
Figure 6:
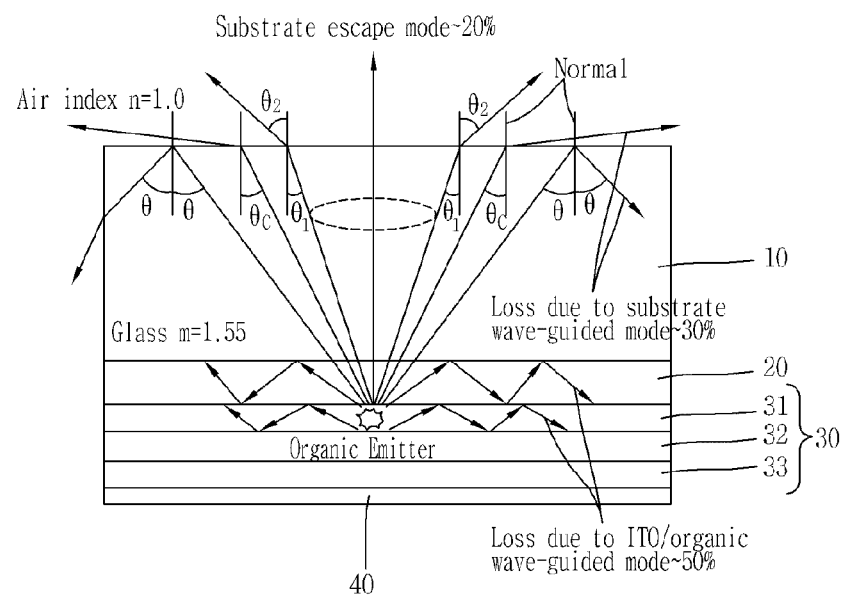
FIG. 6 is a conceptual view depicting the cross-section of an OLED of the related art and a light extraction efficiency thereof.
Figure 7:
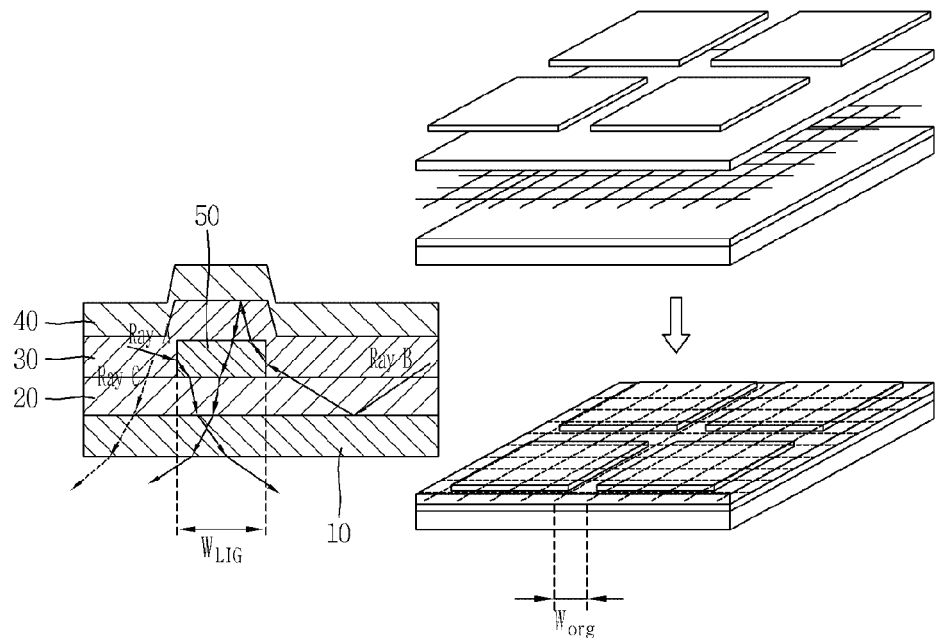
FIG. 7 is cross-sectional, exploded and assembled views showing an OLED according to another example of the related art.
Figure 8:
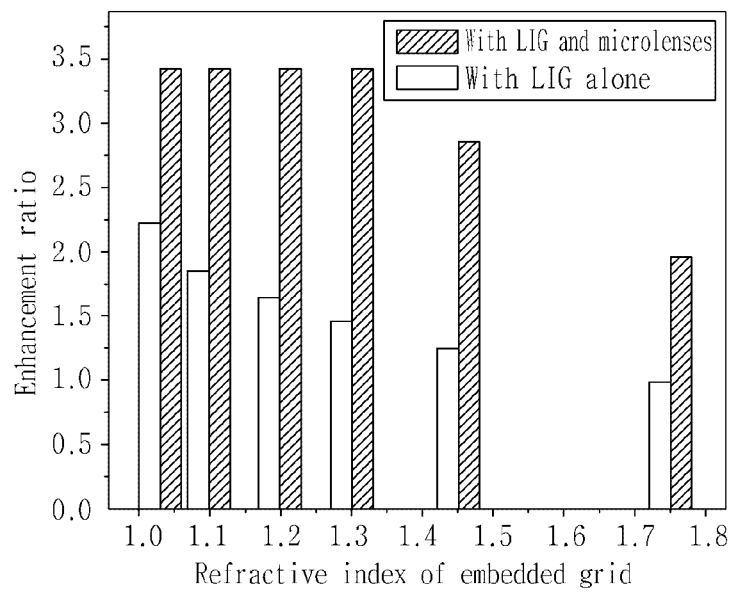
FIG. 8 is a graph showing a simulation result on the light extraction efficiency of the OLED shown in FIG. 7.
Figure 9:
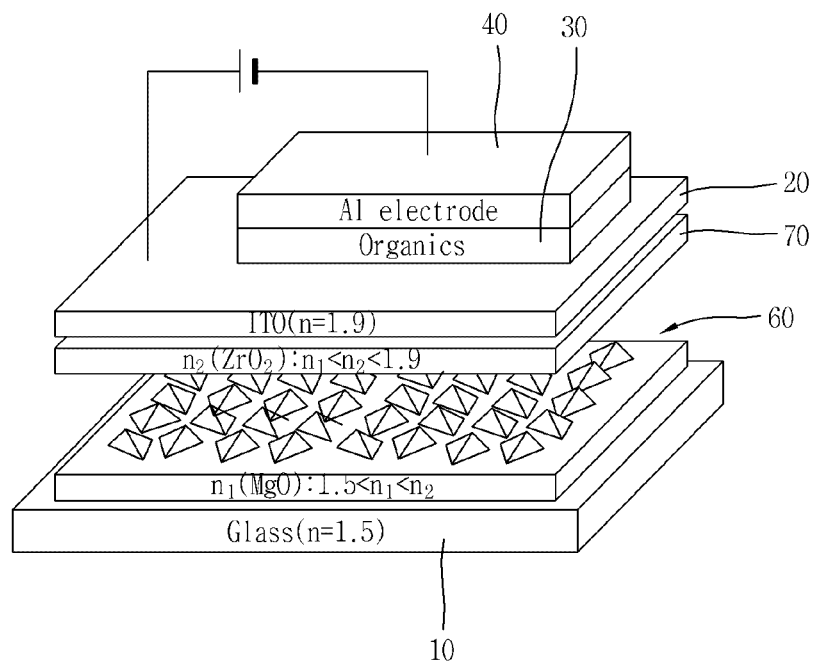
FIG. 9 is an exploded perspective view showing an OLED according to a further example of the related art.

With reference to FIG. 5, a description will be given below of the method of manufacturing a substrate for an OLED according to an embodiment of the invention.

The method of manufacturing a substrate for an OLED according to this embodiment forms the porous layer 210 in at least one portion of one surface of the substrate 200 by eluting at least one component from among the components of the substrate 200 except for silicon dioxide ($SiO_2$), the refractive index of the porous layer 210 being smaller than the refractive index of the substrate 200.

At this time, as shown in FIG. 5, the porous layer 210 can be formed via lithography such that it has a scattering pattern having the semi-oval shape. The process of forming the porous layer 210 of the invention is not limited to the lithography, since the pattern of the porous layer 210 can be formed by a variety of processes.

When the pattern of the porous layer 210 is formed by a well-known process of the variety of processes, first, photoresist (PR) 2 is applied on the surface of the substrate 200. Afterwards, the photoresist 2 is patterned using a mask (not shown) in order to expose a plurality of areas in the surface of the substrate 200 in which the porous layer 210 is to be formed. After that, elution is carried out, so that the porous layer 210 is formed in the open areas of the substrate 200 that are exposed through the patterned photoresist 2 such that the porous layer 210 extends inward from the surface of the substrate 200. Finally, the patterned photoresist 2 is removed via stripping, thereby producing the substrate 200 for an OLED having the porous layer 210 with no stepped portions. Since the refractive index of the porous layer 210 is smaller than the refractive index of the substrate 200, the light extraction efficiency of the OLED 1 can be enhanced.

According to another lithograph process, a metal thin film made of one selected from among Ag, Au, Pt, Pd, Co, Ni, Ti, Al, Sn, Cr and alloys thereof is applied to a thickness of several tens of nanometers on the substrate in order to form a pattern having random pitch sizes. Annealing is followed at a temperature around the melting point of the thin film, so that the metal thin film forms hemispherical nano particles via dewetting. The metal nano particles can be used as a mask when patterning the porous layer and then be removed, thereby producing a substrate having the porous layer. A polymer thin film or an oxide can be used in place of the metal thin film.

The foregoing descriptions of specific exemplary embodiments of the present invention have been presented with respect to the certain embodiments and drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. An organic light-emitting device comprising:
    an organic light-emitting part which includes an anode, an organic light-emitting layer and a cathode which are stacked on each other, and
    a transparent substrate comprising a porous layer including pores in at least one portion of a surface thereof that adjoins the organic light-emitting part, a refractive index of the porous layer being smaller than a refractive index of the transparent substrate,
    wherein the porous layer is formed such that at least one component from among components of the transparent substrate except for silicon dioxide is eluted from the transparent substrate, and the pores are created inside the transparent substrate by the eluting the at least one component, and
    wherein the porous layer is configured as a pattern in plan view, and thereby comprises a porous layer pattern.

2. The organic light-emitting device of claim 1, wherein the transparent substrate is in direct contact with the organic light-emitting part.

3. The organic light-emitting device of claim 1, wherein a surface of the organic light-emitting part and the surface of the transparent substrate which adjoins the organic light-emitting part form a flat surface.

4. The organic light-emitting device of claim 1, wherein the transparent substrate has a cross-section in which the porous layer pattern consists of a plurality of semi-oval cross-sections in a depth direction, a plurality of trapezoidal cross-sections in the depth direction, or a plurality of wedge shaped cross-sections in the depth direction.

5. The organic light-emitting device of claim 4, wherein a width, a depth, and a pitch of each of the plurality of semi-oval cross-sections, the plurality of trapezoidal cross-sections, or the plurality of wedge shaped cross-sections, and the refractive index of the transparent substrate satisfy the following relationships:

$$d:w \leq 2:1, \text{ and}$$

$$w/2 + n_2 d/(n_1^2 - n_2^2)^{1/2} > p,$$

where d indicates the depth, w indicates the width, p indicates the pitch, and $n_1$ indicates the refractive index of the transparent substrate, and $n_2$ indicates a refractive index of air.

6. The organic light-emitting device of claim 5, wherein the pitch is equal to or less than 200 nm or is equal to or greater than 1 μm.

7. The organic light-emitting device of claim 4, wherein the pitch is within a range of a wavelength of light emitted from the organic light-emitting part, and has random values different from each other.

8. The organic light-emitting device of claim 1, wherein the transparent substrate has a cross-section in a depth direction in which the porous layer pattern consists of a plurality of oblong cross-sections.

9. The organic light-emitting device of claim 8, wherein a width, a depth, and a pitch of each of the plurality of oblong cross-sections, and the refractive index of the transparent substrate satisfy the following relationships:

$$d:w \leq 2:1, \text{ and}$$

$$w + n_2 d/(n_1^2 - n_2^2)^{1/2} > p,$$

where d indicates the depth, w indicates the width, p indicates the pitch, $n_1$ indicates the refractive index of the transparent substrate, and $n_2$ indicates a refractive index of air.

10. The organic light-emitting device of claim 9, wherein the pitch is equal to or less than 200 nm or is equal to or greater than 1 μm.

11. The organic light-emitting device of claim 8, wherein the pitch is within a range of a wavelength of light emitted from the organic light-emitting part, and has random values different from each other.

12. The organic light-emitting device of claim 1, wherein the transparent substrate and the porous layer are made of glass.

13. The organic light-emitting device of claim 1, wherein the porous layer pattern as seen in plan view comprises one selected from the group consisting of a grid pattern, a pattern consisting of a plurality of stripes, a pattern consisting of a plurality of waves, a honeycomb pattern and a pattern consisting of a plurality of dots.

* * * * *